United States Patent
Eguchi et al.

(10) Patent No.: US 11,051,438 B2
(45) Date of Patent: Jun. 29, 2021

(54) METHOD OF DETERMINING DISPOSITION OF COMPONENT REEL AND APPARATUS FOR DETERMINING DISPOSITION OF COMPONENT REEL

(71) Applicant: Panasonic Intellectual Property Management Co., Ltd., Osaka (JP)

(72) Inventors: Ryouji Eguchi, Fukuoka (JP); Hiroki Kobayashi, Fukuoka (JP); Daisuke Mizokami, Fukuoka (JP); Takaaki Yokoi, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 295 days.

(21) Appl. No.: 16/357,503

(22) Filed: Mar. 19, 2019

(65) Prior Publication Data
US 2019/0307034 A1 Oct. 3, 2019

(30) Foreign Application Priority Data
Mar. 30, 2018 (JP) .............................. JP2018-067335

(51) Int. Cl.
*H05K 13/04* (2006.01)
*H05K 13/02* (2006.01)
*H05K 13/08* (2006.01)

(52) U.S. Cl.
CPC ......... *H05K 13/0417* (2013.01); *H05K 13/02* (2013.01); *H05K 13/086* (2018.08);
(Continued)

(58) Field of Classification Search
CPC .. H05K 13/02; H05K 13/021; H05K 13/0417; H05K 13/0419; H05K 13/081;
(Continued)

(56) References Cited

U.S. PATENT DOCUMENTS

| | | | | |
|---|---|---|---|---|
| 5,822,210 A | * | 10/1998 | Kobayashi | H01L 22/20 700/121 |
| 2018/0046736 A1 | * | 2/2018 | Sugimoto | H05K 13/085 |
| 2018/0049353 A1 | * | 2/2018 | Michizoe | H05K 13/0417 |

FOREIGN PATENT DOCUMENTS

WO 2016/142988 9/2016

* cited by examiner

*Primary Examiner* — Peter Dungba Vo
*Assistant Examiner* — Joshua D Anderson
(74) *Attorney, Agent, or Firm* — Pearne & Gordon LLP

(57) ABSTRACT

A method of determining disposition of a component reel, for determining component reel disposition in which the component reel obtained by winding a component accommodating tape is disposed in a holding unit, includes: acquiring component reel information including information for identifying the component reel, holding unit information including information related to a layout that is capable of being selected when the component reel is disposed in the holding unit, disposition information of the component supply device supplying the component accommodating tape drawn out from the component reel disposed in the holding unit, and constraint condition information related to the component supply device and the component accommodating tape to be supplied to the component supply device; and determining the component reel disposition in which one component reel firstly used by the component supply device among a plurality of the component reels and a next component reel used next by the component supply device among the plurality of component reels are disposed, based on the acquired component reel information, the acquired holding unit information, the acquired disposition information, and the acquired constraint condition information.

12 Claims, 17 Drawing Sheets

(52) U.S. Cl.
CPC ..... *H05K 13/0857* (2018.08); *H05K 13/0419* (2018.08); *Y10T 29/53174* (2015.01)

(58) Field of Classification Search
CPC ........... H05K 13/0853; H05K 13/0857; H05K 13/086; H05K 13/087; Y10T 29/53174; Y10T 29/53187; G05B 2219/36195
See application file for complete search history.

FIG. 9

| REEL NUMBER | REEL DIAMETER | RECEIVING TAPE WIDTH | COMPONENT NAME |
|---|---|---|---|
| RS101 | S | 4mm | D1234 |
| RS102 | S | 4mm | D2345 |
| ... | ... | ... | ... |
| RS201 | S | 8mm | D3456 |
| ... | ... | ... | ... |
| RL101 | L | 4mm | D4567 |
| ... | ... | ... | ... |
| RL201 | L | 8mm | D5678 |
| ... | ... | ... | ... |
| ↑ | ↑ | ↑ | ↑ |
| 41 | 42 | 43 | 44 |

FIG. 10

| LAYOUT NUMBER | FIRST HOLDING ROW L1 | SECOND HOLDING ROW L2 | THIRD HOLDING ROW L3 | FOURTH HOLDING ROW L4 |
|---|---|---|---|---|
| #1 | S | S | S | S |
| #2 | – | S | S | S |
| #3 | S | – | S | S |
| #4 | S | S | – | S |
| #5 | S | S | S | – |
| #6 | – | – | S | S |
| #7 | – | S | – | S |
| #8 | – | S | S | – |
| #9 | S | – | – | S |
| #10 | S | – | S | – |
| #11 | S | S | – | – |
| #12 | S | – | – | – |
| #13 | – | S | – | – |
| #14 | – | – | S | – |
| #15 | – | – | – | S |
| #16 | S | S | L | – |
| #17 | – | S | L | – |
| #18 | S | – | L | – |
| #19 | – | – | L | – |
| #20 | – | L | S | – |
| #21 | – | L | – | – |
| #22 | – | L | L | – |
| #23 | – | – | L | – |
| #24 | – | – | – | – |

| SLOT NUMBER | FEEDER NUMBER | FEEDER TYPE | TRANSPORT TAPE WIDTH |
|---|---|---|---|
| S1L | FA101 | AUTOMATIC | 4mm |
| S1R | – | – | – |
| S2L | FA102 | AUTOMATIC | 4mm |
| S2R | – | – | – |
| S3 | FA201 | AUTOMATIC | 8mm |
| S4 | FA202 | AUTOMATIC | 8mm |
| S5 | FA203 | AUTOMATIC | 8mm |
| S6 | FM201 | MANUAL | 8mm |
| S7L | FM101 | MANUAL | 4mm |
| S7R | FM102 | MANUAL | 4mm |
| S8 | FM202 | MANUAL | 8mm |
| S9 | FM203 | MANUAL | 8mm |
| S10 | FA204 | AUTOMATIC | 8mm |
| S11 | FA205 | AUTOMATIC | 8mm |
| S12 | FA206 | AUTOMATIC | 8mm |
| S13 | FM204 | MANUAL | 8mm |
| S14 | FM205 | MANUAL | 8mm |
| S15L | FA103 | AUTOMATIC | 4mm |
| S15R | – | – | – |
| S16L | FM103 | MANUAL | 4mm |
| S16R | FM104 | MANUAL | 4mm |
| S17L | FM105 | MANUAL | 4mm |
| S17R | FM106 | MANUAL | 4mm |

| SLOT NUMBER | FIRST HOLDING ROW L1 | SECOND HOLDING ROW L2 | THIRD HOLDING ROW L3 | FOURTH HOLDING ROW L4 |
|---|---|---|---|---|
| S1  | ○ | ○ | ○ | ○ |
| S2  | ○ | ○ | ○ | ○ |
| S3  | ○ | ○ | – | – |
| S4  | ○ | ○ | ○ | ○ |
| S5  | ○ | ○ | ○ | ○ |
| S6  | ○ | ○ | – | – |
| S7  | ○ | ○ | ○ | ○ |
| S8  | ○ | ○ | ○ | ○ |
| S9  | ○ | ○ | – | – |
| S10 | ○ | ○ | ○ | ○ |
| S11 | ○ | ○ | ○ | ○ |
| S12 | ○ | ○ | – | – |
| S13 | ○ | ○ | – | – |
| S14 | ○ | ○ | – | – |
| S15 | ○ | ○ | – | – |
| S16 | ○ | ○ | ○ | ○ |
| S17 | ○ | ○ | ○ | ○ |

| SLOT NUMBER | FIRST HOLDING ROW L1 | SECOND HOLDING ROW L2 | THIRD HOLDING ROW L3 | FOURTH HOLDING ROW L4 |
|---|---|---|---|---|
| S1 | RS101/ S1L/A | RS103/ S1L/B | – | – |
| S2 | – | RL101/ S2L/A | RS102/ S2L/B | – |
| S3 | – | RL201/ S3/A | – | – |
| S4 | – | RL203/ S4/A | RL202/ S3/B | – |
| S5 | RS201/ S5/A | RS202/ S5/B | RL204/ S4/B | – |
| S6 | RS203/ S5/A | RS204/ S5/B | – | – |
| S7 | – | RL103/ S7L/A | RL104/ S7R/A | – |
| S8 | RS205/ S8/A | – | – | – |
| ... | ... | ... | ... | ... |

| | | 1 | 2 | 3 | 4 | 5 | 6 | ... ←101 |
|---|---|---|---|---|---|---|---|---|
| FIRST HOLDING ROW L1 | FOLDER NUMBER | | | | | | | |
| | REEL NUMBER | RS101 | — | — | — | RS201 | RS203 | ←41 ⎫ |
| | REEL DIAMETER | S | — | — | — | S | S | ←42 ⎬ 102 |
| | TAPE POSITION | S01L | — | — | — | S05 | S06 | ←106 |
| | PRECEDING/FOLLOWING | A | — | — | — | A | A | ←107 ⎭ |
| SECOND HOLDING ROW L2 | REEL NUMBER | RS103 | RL101 | RL201 | RL203 | RS202 | RS204 | ←41 ⎫ |
| | REEL DIAMETER | S | L | L | L | S | S | ←42 ⎬ 103 |
| | TAPE POSITION | S01L | S02L | S03L | S03R | S05 | S06 | ←106 |
| | PRECEDING/FOLLOWING | B | A | — | — | B | B | ←107 ⎭ |
| THIRD HOLDING ROW L3 | REEL NUMBER | — | RL102 | — | — | RS206 | — | ←41 ⎫ |
| | REEL DIAMETER | — | L | — | — | S | — | ←42 ⎬ 104 |
| | TAPE POSITION | — | S02L | — | — | S04 | — | ←106 |
| | PRECEDING/FOLLOWING | — | B | — | — | A | — | ←107 ⎭ |
| FOURTH HOLDING ROW L4 | REEL NUMBER | — | — | — | — | RS207 | — | ←41 ⎫ |
| | REEL DIAMETER | — | — | — | — | S | — | ←42 ⎬ 105 |
| | TAPE POSITION | — | — | — | — | S04 | — | ←106 |
| | PRECEDING/FOLLOWING | — | — | — | — | B | — | ←107 ⎭ |

METHOD OF DETERMINING DISPOSITION OF COMPONENT REEL AND APPARATUS FOR DETERMINING DISPOSITION OF COMPONENT REEL

BACKGROUND

1. Technical Field

The present disclosure relates to a method of determining disposition of a component reel and an apparatus for determining disposition of a component reel, which determine component reel disposition in which the component reel is disposed in a holding unit.

2. Description of the Related Art

In a component placement machine that places a component on a board, a plurality of component reels obtained by winding component accommodating tapes accommodating components and a plurality of component supply devices that transport the component accommodating tapes drawn out from the component reels to supply the components are disposed. The component supply devices and the component reels are disposed in a carriage (a holding unit), and the disposition in the holding unit is determined such that productivity of the component placement machine increases. An automatic load feeder that automatically switches to a following component accommodating tape for component replenishment, which is inserted while a component is supplied from a leading component accommodating tape and continues component supply, in addition to a manual load feeder that performs component replenishment by joining a tip end portion of a novel component accommodating tape to a rear end portion of a supplied component accommodating tape by a tape, has been known as the component supply devices (for example, International Publication No. 2016/142988).

Determination of disposition of the component supply devices and the component reels such that a cycle time during which the componentent is placed on the board is minimized while a replacement time for the component supply devices and the component reels is reduced when the type of the produced board is changed in a state in which the automatic load feeder is fixedly disposed at a center of the holding unit and the manual load feeder is movably disposed at the other position, is disclosed in International Publication No. 2016/142988.

SUMMARY

According to the present disclosure, there is provided a method of determining disposition of a component reel, for determining component reel disposition in which a plurality of the component reels obtained by winding a plurality of component accommodating tapes accommodating components to be supplied to a component supply device are disposed in a holding unit that holds the plurality of component reels, the method including: acquiring component reel information including information for identifying the plurality of component reels, holding unit information including information related to a layout that is capable of being selected when the plurality of component reels are disposed in the holding unit, disposition information of the component supply device supplying the plurality of component accommodating tapes drawn out from the plurality of component reels, and constraint condition information related to the component supply device and the plurality of component accommodating tapes to be supplied to the component supply device; and determining the component reel disposition in which one component reel firstly used by the component supply device among the plurality of component reels and a next component reel used next by the component supply device among the plurality of component reels are disposed, based on the acquired component reel information, the acquired holding unit information, the acquired disposition information, and the acquired constraint condition information.

According to the present disclosure, there is provided an apparatus for determining disposition of a component reel, which determines component reel disposition in which a plurality of the component reels obtained by winding a plurality of component accommodating tapes accommodating components to be supplied to a component supply device are disposed in a holding unit that holds the plurality of component reels, the apparatus including: an information acquiring unit that acquires component reel information including information for identifying the plurality of component reels, holding unit information including information related to a layout that is capable of being selected when the plurality of component reels are disposed in the holding unit, disposition information of the component supply device supplying the plurality of component accommodating tapes drawn out from the plurality of component reels, and constraint condition information related to the component supply device and the plurality of component accommodating tapes to be supplied to the component supply device; and a component reel disposition determining unit that determines the component reel disposition in which one component reel firstly used by the component supply device among the plurality of component reels and a next component reel used next by the component supply device among the plurality of component reels are disposed, based on the acquired component reel information, the acquired holding unit information, the acquired disposition information, and the acquired constraint condition information.

According to the present disclosure, optimum component reel disposition can be determined.

BRIEF DESCRIPTION OF THE DRAWINGS

FIG. 9 is a diagram for illustrating an example of information on the component reel used in the component placement machine according to the embodiment of the present disclosure;

FIG. 10 is a table for illustrating an example of information on a layout in which the component reel is disposed in a holding unit according to the embodiment of the present disclosure;

FIG. 11 is a table for illustrating an example of feeder disposition in which a tape feeder is disposed in the holding unit according to the embodiment of the present disclosure;

FIG. 14 is a table for illustrating an example of a position where the component reel can be disposed in the holding unit according to the embodiment of the present disclosure;

FIG. 15 is a table for illustrating an example of component reel disposition in which the component reel is disposed in the holding unit according to the embodiment of the present disclosure;

FIG. 16 is a table for illustrating another example of the component reel disposition in which the component reel is disposed in the holding unit according to the embodiment of the present disclosure.

DETAILED DESCRIPTION

In the related art disclosed in International Publication No. 2016/142988 as described above, disposition in which an automatic load feeder is fixed to a center of the holding unit is not the best disposition. Further, since disposition of component reels is limited in each automatic load feeder which occupies two component reels, when the automatic load feeder is movably disposed, there is a problem in that extensive manhours are required for an operation of determining disposition of the component reels.

Here, an aspect of the present disclosure is to provide a method of determining disposition of a component reel and an apparatus for determining disposition of a component reel, which can determine optimum component reel disposition.

Figure 1:
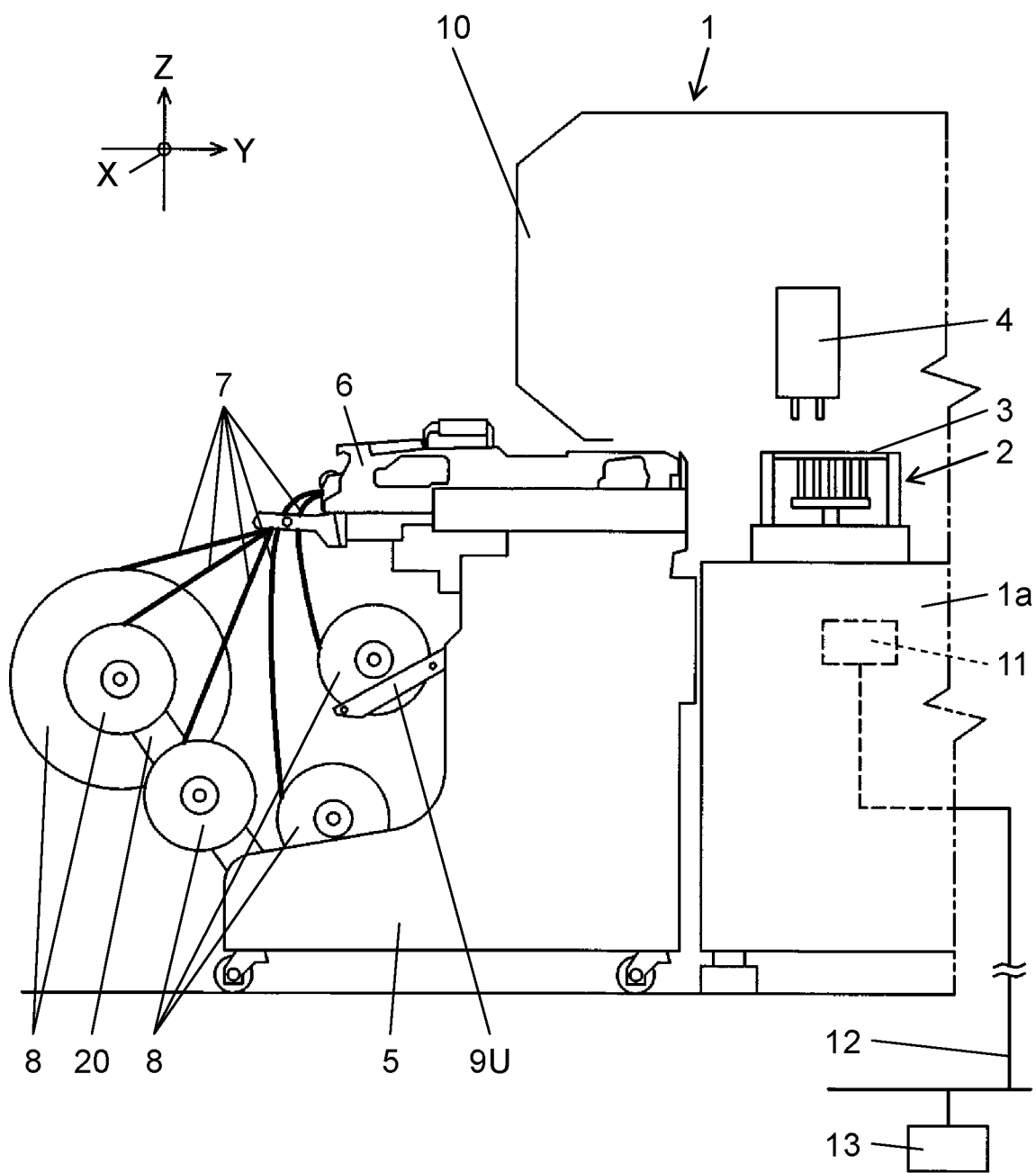
FIG. 1 is a diagram for illustrating a configuration of a component placement machine according to an embodiment of the present disclosure.

An embodiment of the present disclosure will be described in detail with reference to the following drawings. Configurations, shapes, and the like described below are examples for explanation, and can be appropriately changed in accordance with specifications of a component placement machine, a tape feeder, a carriage, a component reel, and the like. Hereinafter, corresponding elements in all the drawings are designated by the same reference numerals, and duplicated description will be omitted. In FIG. 1 and a part described below, an X direction (a direction that is perpendicular to a paper surface in FIG. 1) in a board transport direction and a Y direction (a left-right direction in FIG. 1) that is perpendicular to the board transport direction are shown as two axis directions that perpendicular to each other in a horizontal plane. Further, a Z direction (an up-down direction in FIG. 1) is shown as a height direction that is perpendicular to a horizontal plane.

First, a configuration of component placement machine 1 will be described with reference to FIG. 1. Component placement machine 1 functions to manufacture a placement board on which a component is loaded. Board transport mechanism 2 provided on an upper surface of base 1a transports board 3 in the X direction to determine and hold a position of board 3. Mounting head 4 that moves in a horizontal direction (the X direction and the Y direction) by a not-illustrated head moving mechanism is installed above board transport mechanism 2.

A plurality of tape feeders 6 are provided at an upper portion of carriage 5 coupled to base 1a on a lateral side of board transport mechanism 2 side by side in the X direction. Tape feeders 6 are a component supply device that transports component accommodating tapes 7 drawn out from component reels 8, on which component accommodating tapes 7 accommodating the component to be supplied to component placement machine 1 is wound, in a tape feeding direction, and supplies the component to a component pickup position by mounting head 4.

A plurality of upper reel holding units 9U aligned in the X direction and a plurality of lower reel holding units 9B aligned in the X direction are vertically provided on a front side of carriage 5 and below tape feeders 6 (see FIG. 2). Upper reel holding units 9U and lower reel holding units 9B rotatably hold component reels 8, respectively. A plurality of reel holders 20 are mounted in front of lower reel holding units 9B side by side in the X direction. Reel holders 20 can be detachably attached to carriage 5 and can hold the plurality of component reels 8. Carriage 5 is detachably attached to component placement machine 1, and a plurality of types of holdable tape feeders 6 having different amounts and a plurality of types of component reels 8 having different amounts are prepared depending on mounted component placement machine 1.

In FIG. 1, openable/closeable body cover 10 that performs covering to prevent a worker from touching a movable mechanism such as mounting head 4 during a component placement operation is installed above carriage 5. Component placement machine 1 includes mounting controller 11 that controls board transport mechanism 2, mounting head 4, and the head moving mechanism. Mounting controller 11 transmits a component supply command to tape feeders 6, controls mounting head 4 and head moving mechanism, picks up, by mounting head 4, the component supplied to the component pickup position by tape feeders 6, and executes a component placing operation of transporting and placing to the component placement position of board 3 held on board transport mechanism 2.

Mounting controller 11 is connected to management computer 13 via wired or wireless communication network 12, and can transmit/receive data to/from management computer 13. Management computer 13 manages production of a mounting board manufactured in a component mounting line including component placement machine 1, manages resources such as carriage 5, tape feeders 6, and component reels 8 used in component mounting line, determines disposition of tape feeders 6 on carriage 5, and determines disposition of component reels 8 on carriage 5 and reel holders 20.

Next, a configuration and a function of carriage 5 according to the present embodiment will be described with reference to FIG. 2. Feeder mounting portion 5a is installed at an upper portion of carriage 5. A plurality of (here, 17) slots S1 to S17 on which tape feeders 6 are mounted are formed on an upper surface of feeder mounting portion 5a at regular intervals in the board transport direction (the X direction) while being mounted on component placement machine 1. One standard tape feeder 6L and two thin tape feeders 6S can be mounted in one slot S. Two thin tape feeders 6S are mounted on slot S15. For convenience, in slot S15, a position of thin tape feeder 6S on the left side is referred to as slot S15L and a position of thin tape feeder 6S on the right side is referred to as slot S15R.

Figure 2:
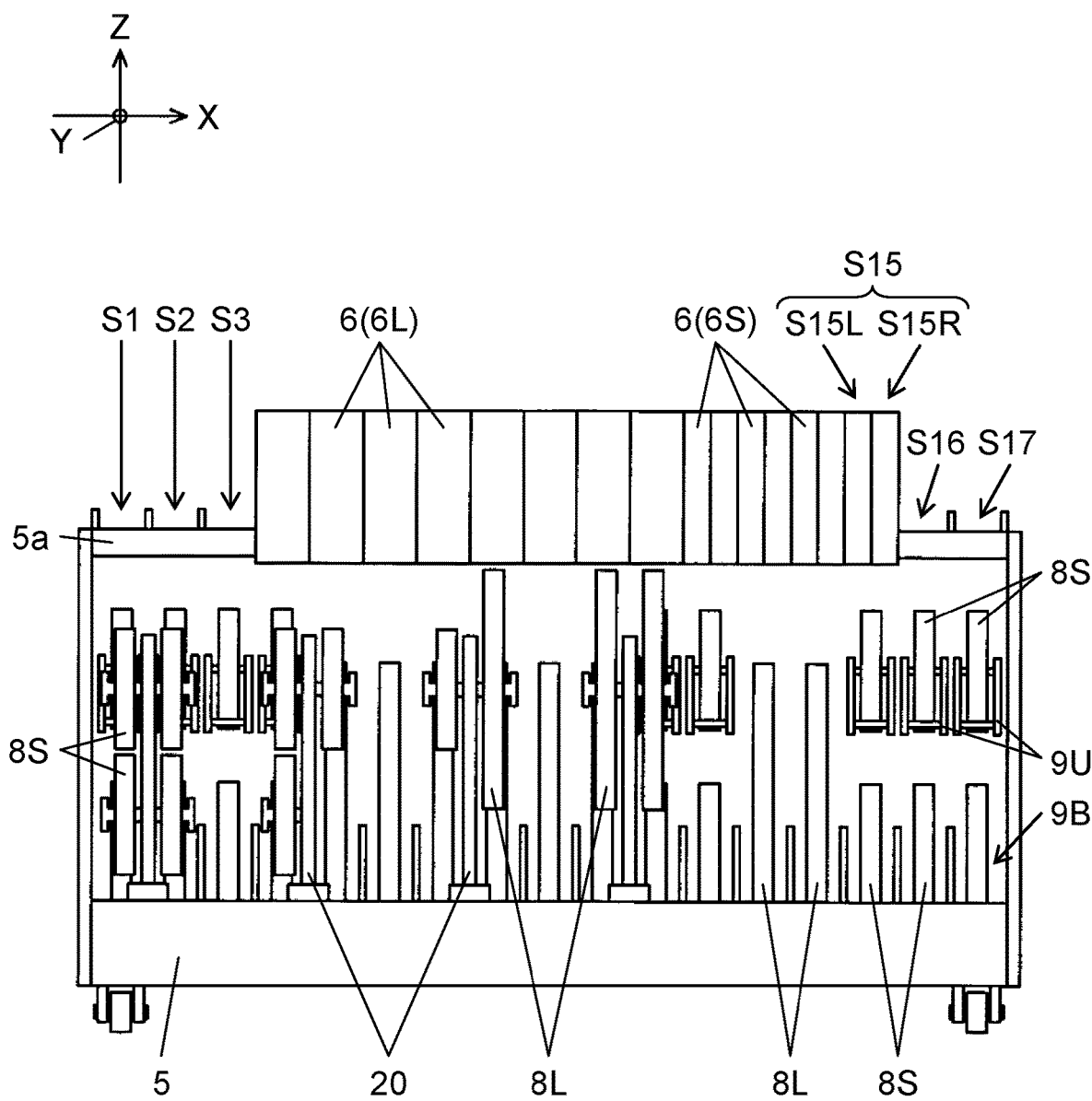
FIG. 2 is a diagram for illustrating a configuration of a carriage mounted on the component placement machine according to the embodiment of the present disclosure.

In FIG. 2, a plurality of (here, 17) lower reel holding units 9B are formed below feeder mounting portion 5a at regular intervals in the X direction to correspond to the positions of slots S1 to S17. A plurality of (maximally, 17) upper reel holding units 9U can be mounted between feeder mounting portion 5a and lower reel holding units 9B at regular intervals in the X direction to correspond to the positions of slots S1 to S17. Upper reel holding units 9U are detachable, and can each have one small component reel 8S having a small reel diameter.

Lower reel holding units 9B can each have one small component reel 8S or one large component reel 8L having a large reel diameter. When large component reel 8L is held on lower reel holding unit 9B, upper reel holding unit 9U cannot be mounted at a position of the same slot S which interferes with held large component reel 8L. That is, when large component reel 8L is held on lower reel holding unit 9B, small component reel 8S cannot be held at a position where upper reel holding unit 9U can be mounted at same slot S.

In FIG. 2, reel holder 20 is mounted on a front side of lower reel holding unit 9B and between slots S. Reel holder 20 mounted on carriage 5 can hold two small component reels 8S on the left and right sides or one large component reel 8L. A position of small component reels 8S or large component reel 8L held by reel holder 20 is a position of any one of left and right slots S at a position (between slots 5) where reel holder 20 is mounted.

For example, a position of component reel 8 on which reel holder 20 mounted between a position of slot S1 and a position of slot S2 is held is a position of slot S1 or a position of slot S2. Reel holder 20 is mounted on carriage 5 with a gap which is apart from a space between component reels 8 mounted on left and right reel holders 20 and where the worker can perform working.

Figure 3A:
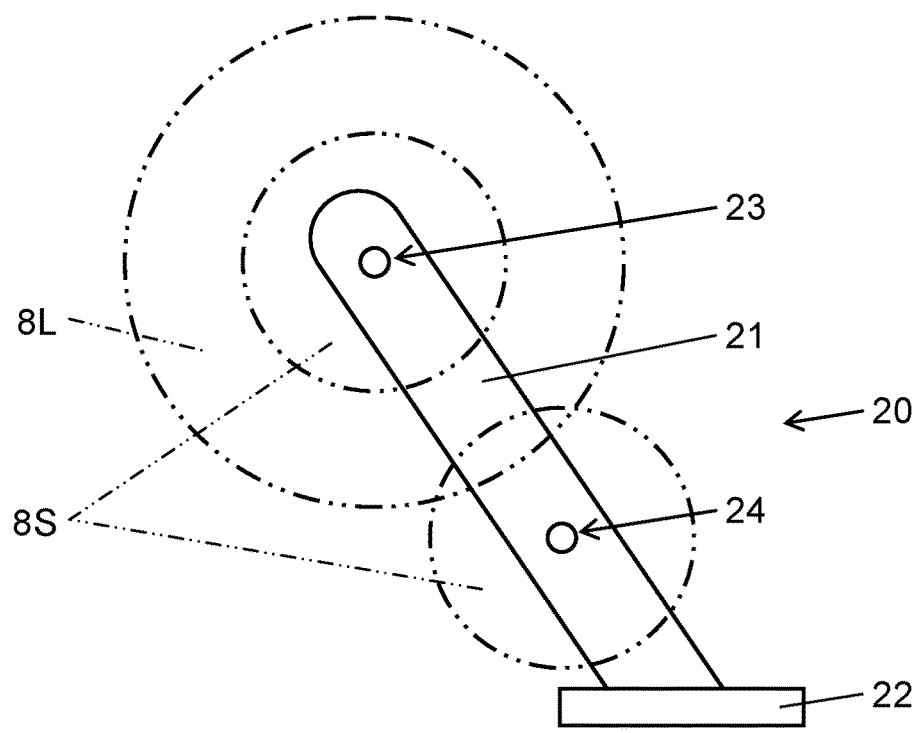
FIG. 3A is a diagram for illustrating a reel holder mounted on the carriage according to the embodiment of the present disclosure.
Figure 3B:
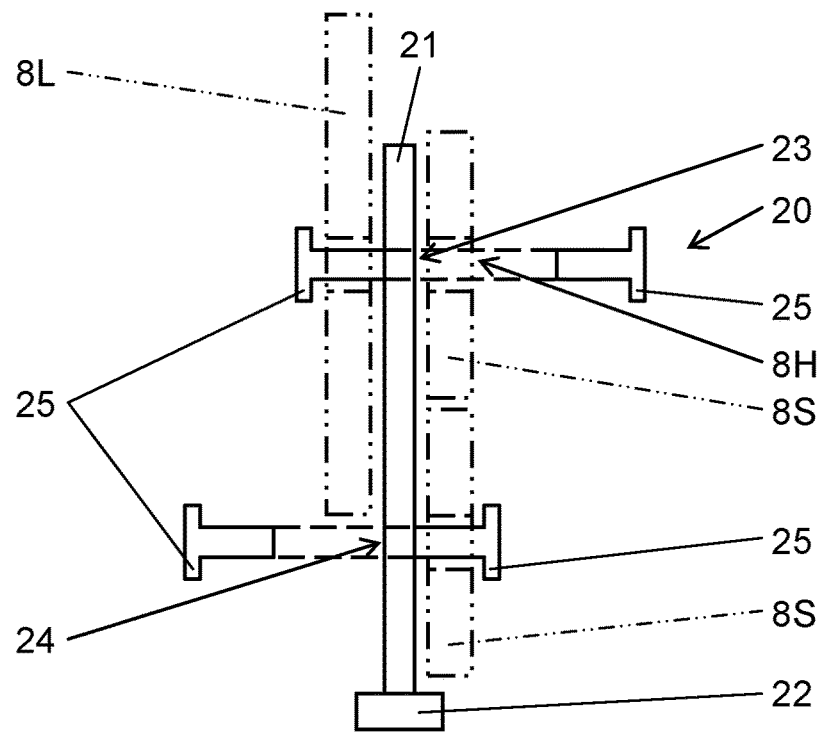
FIG. 3B is a diagram for illustrating the reel holder mounted on the carriage according to the embodiment of the present disclosure.

Next, a configuration and a function of reel holder 20 will be described with reference to FIGS. 3A and 3B. Reel holder 20 includes plate-shaped arm portion 21 and mounting portion 22. Reel holder 20 is fixed to carriage 5 by mounting mounting portion 22 on carriage 5. Arm portion 21 extends upward from an upper portion of mounting portion 22. Arm portion 21 is inclined outward in a state in which reel holder 20 is mounted on carriage 5. Upper pin installation hole 23 and lower pin installation hole 24 are vertically formed at arm portion 21. Reel holding pins 25 are inserted through left and right sides of upper pin installation hole 23 and lower pin installation hole 24. Core holes 8H formed at centers of small component reels 8S and large component reel 8L can be inserted into reel holding pins 25.

Reel holding pin 25 inserted into lower pin installation hole 24 can hold small component reel 8S. Reel holding pin 25 inserted into upper pin installation hole 23 can hold small component reel 8S and large component reel 8L. Hereinafter, when there is no need to distinguish small component reels 8S from large component reel 8L, small component reels 8S and large component reel 8L are referred to as component reel 8. Further, the position of reel holding pin 25 inserted into upper pin installation hole 23 is referred to as an upper holding position of reel holder 20, and the position of reel holding pin 25 inserted into lower pin installation hole 24 is referred to as a lower holding position of reel holder 20.

Figure 4A:
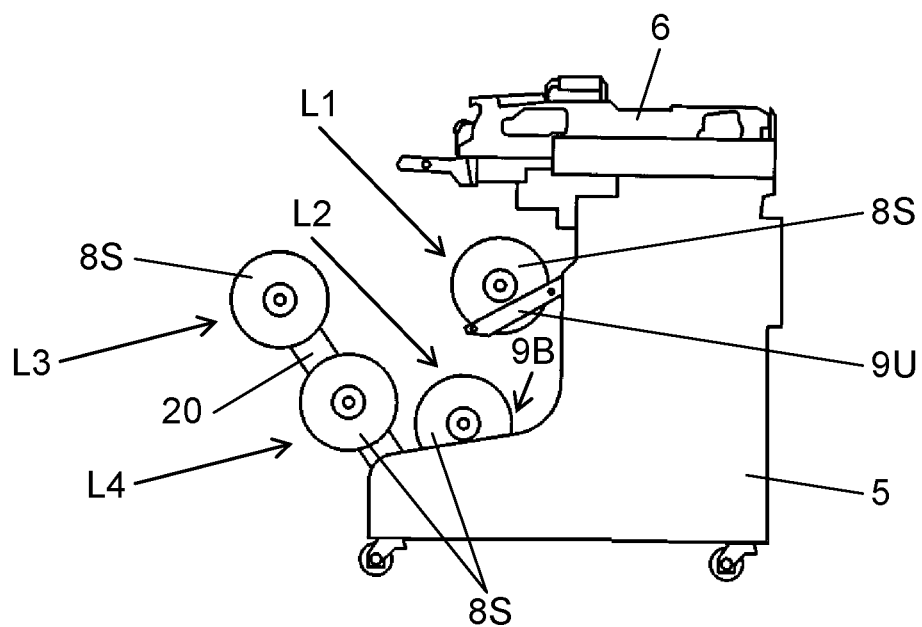
FIG. 4A is a diagram for illustrating an example of a layout in which a component reel is disposed in the carriage according to the embodiment of the present disclosure.

Next, an example of a layout that can be selected when component reel 8 is disposed in carriage 5 or reel holder 20 mounted on carriage 5 will be described with reference to FIGS. 4A, 4B, 5A, and 5B. FIG. 4A illustrates a layout in which small component reels 8S are held on upper reel holding unit 9U and lower reel holding unit 9B located at a position of the same slot S, and the upper holding position and the lower holding position of reel holder 20, respectively. Hereinafter, a plurality of upper reel holding units 9U aligned in an disposition direction (the X direction) of tape feeders 6 are referred to as first holding row L1, a plurality of lower reel holding units 9B aligned in the disposition direction (the X direction) of tape feeders 6 are referred to as second holding row L2, upper holding positions of a plurality of reel holders 20 aligned in the disposition direction (the X direction) of tape feeders 6 are referred to as third holding row L3, and lower holding positions of a plurality of reel holders 20 aligned in the disposition direction (the X direction) of tape feeders 6 are referred to as fourth holding row L4.

Figure 4B:
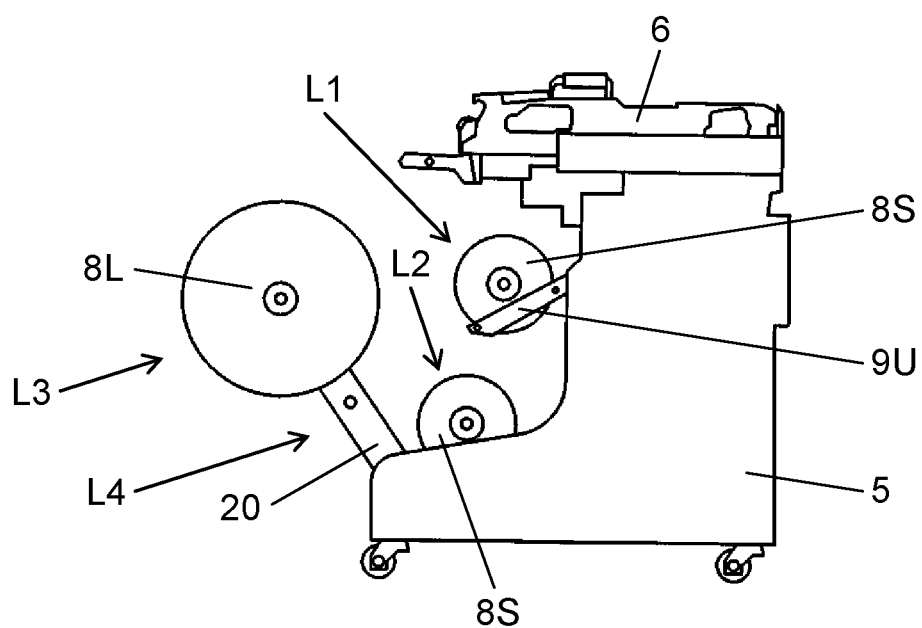
FIG. 4B is a diagram for illustrating an example of a layout in which the component reel is disposed in the carriage according to the embodiment of the present disclosure.

FIG. 4B illustrates a layout in which small component reels 8S are held on first holding row L1 and second holding row L2 located at the position of the same slot S, and large component reel 8L is held on third holding row L3. When large component reel 8L is held on third holding row L3, since large component reel 8L and component accommodating tapes 7 may interfere with each other, component reel 8 cannot be held on fourth holding row L4 located at the position of the same slot S.

Figure 5A:
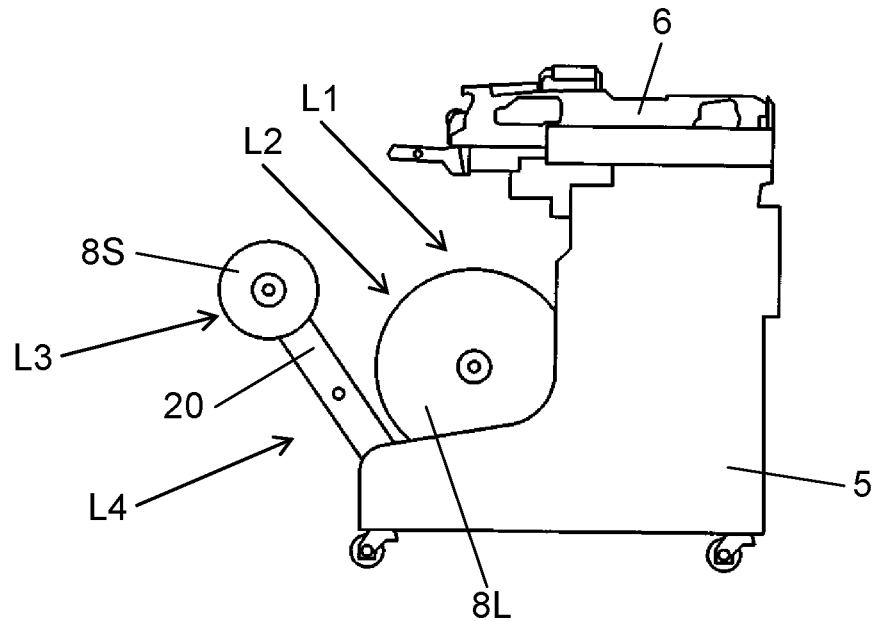
FIG. 5A is a diagram for illustrating an example of a layout in which the component reel is disposed in the carriage according to the embodiment of the present disclosure.
Figure 5B:
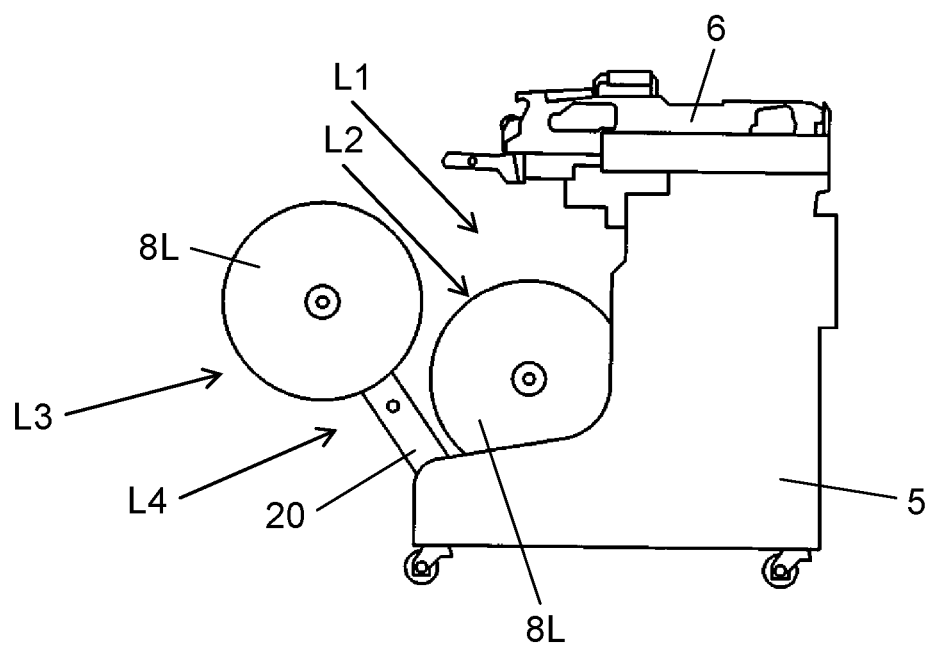
FIG. 5B is a diagram for illustrating an example of a layout in which the component reel is disposed in the carriage according to the embodiment of the present disclosure.

FIG. 5A illustrates a layout in which large component reel 8L is held on second holding row L2 located at the position of the same slot S and small component reel 8S is held on third holding row L3. FIG. 5B illustrates a layout in which large component reel 8L is held on second holding row L2 located at the position of the same slot S and large component reel 8L is held on third holding row L3. When large component reel 8L is held on second holding row L2, since large component reel 8L and component accommodating tapes 7 may interfere with each other, component reel 8 cannot be held on first holding row L1 and fourth holding row L4 located at the position of the same slot S.

In this way, holding rows L1 to L4 hold a plurality of component reels 8. Thus, carriage 5 and reel holder 20 mounted on carriage 5 constitute a holding unit having the plurality of holding rows L1 to L4. A position in a direction (the Y direction) perpendicular to a horizontal plane in a direction (the X direction) in which tape feeders 6 (component supply devices) in a plurality of holding rows L1 to L4 are lined is close to tape feeders 6 mounted on carriage 5 in an order of first holding row L1, second holding row L2, fourth holding row L4, and third holding row L3. Further, a layout that can be selected when component reel 8 is disposed in the holding unit changes depending on a reel diameter of component reel 8 disposed in the holding unit.

Figure 6A:
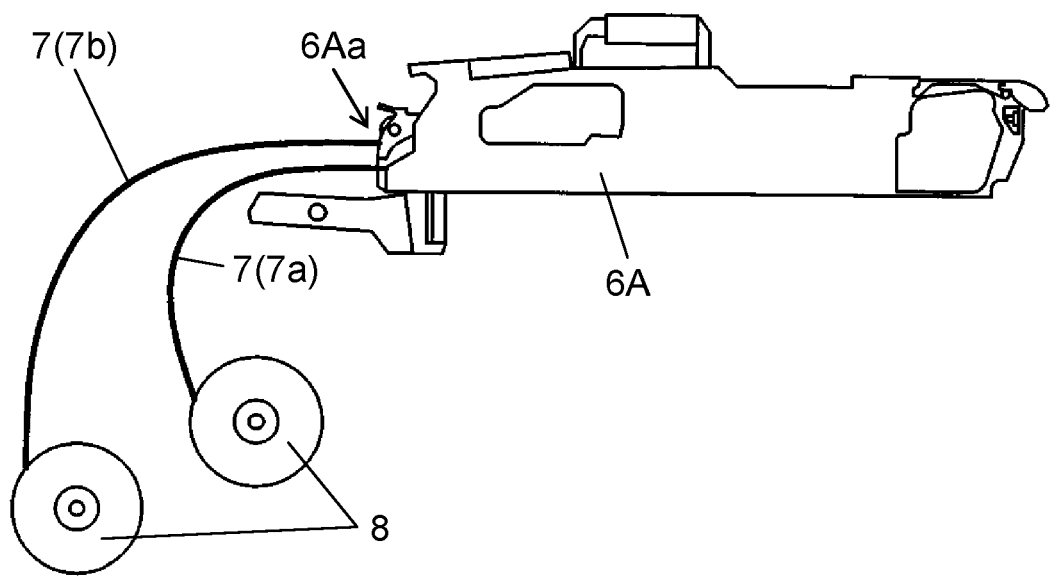
FIG. 6A is a diagram for illustrating an automatic load feeder mounted on the carriage according to the embodiment of the present disclosure.

Next, automatic load feeder 6A and manual load feeder 6M which are tape feeders 6 used while being mounted on carriage 5 will be described with reference to FIGS. 6A and 6B. In FIG. 6A, component accommodating tapes 7 (hereinafter, referred to as "leading tape 7a") that supply the component to the component pickup position are inserted into automatic load feeder 6A from insertion port 6Aa. In replenishment of components, the worker draws out component accommodating tape 7 (hereinafter, referred to as "following tape 7b") from component reel 8 for component replenishment and inserts component accommodating tape 7 into an upper portion of insertion port 6Aa into which leading tape 7a is inserted. Leading tape 7a is supplied from one component reel which is initially used by the component supply device. Further, following tape 7b is supplied from a next component reel to be used next by the component supply device among the plurality of component reels.

When supply of the component is continuously performed and the component of leading tape 7a is run out, automatic load feeder 6A automatically switches component accommodating tape 7 supplying the component to following tape 7b to continue the supply of the component. In this way, automatic load feeder 6A automatically switches and supplies the plurality of component accommodating tapes 7 (leading tape 7a and following tape 7b) drawn out and inserted from the plurality of component reels 8.

Figure 6B:
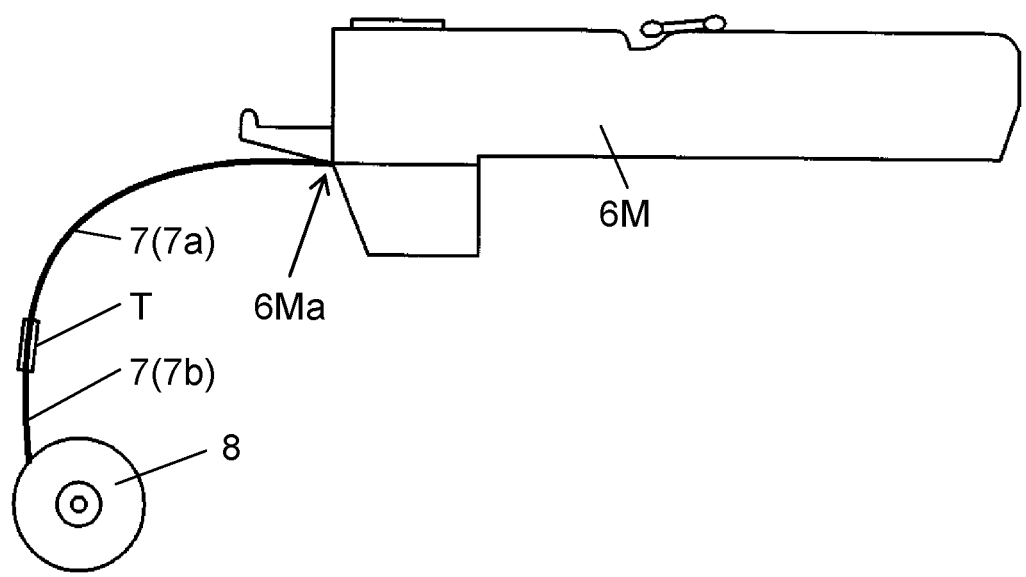
FIG. 6B is a diagram for illustrating a manual load feeder mounted on the carriage according to the embodiment of the present disclosure.

In FIG. 6B, in manual load feeder 6M, leading tape 7a is inserted from insertion port 6Ma, and the component is supplied to the component pickup position. When remaining leading tape 7a inserted from insertion port 6Ma becomes small, the worker replenishes the component. In the replenishment of components, the worker draws out following tape 7b from component reel 8 for component replenishment, and joins a tip end portion of following tape 7b to a rear end portion of leading tape 7a through splicing tape T. Joined following tape 7b is transported to manual load feeder 6M subsequent to leading tape 7a, so that the supply of the component continues.

Automatic load feeder 6A and manual load feeder 6M are prepared in a plurality of types such as a standard type or a thin type to correspond to a tape width of component accommodating tape 7 to be transported. Hereinafter, when there is no need to distinguish the tape width of component accommodating tape 7 to be transported, automatic load feeder 6A and manual load feeder 6M are simply referred to as tape feeder 6.

Figure 7A:
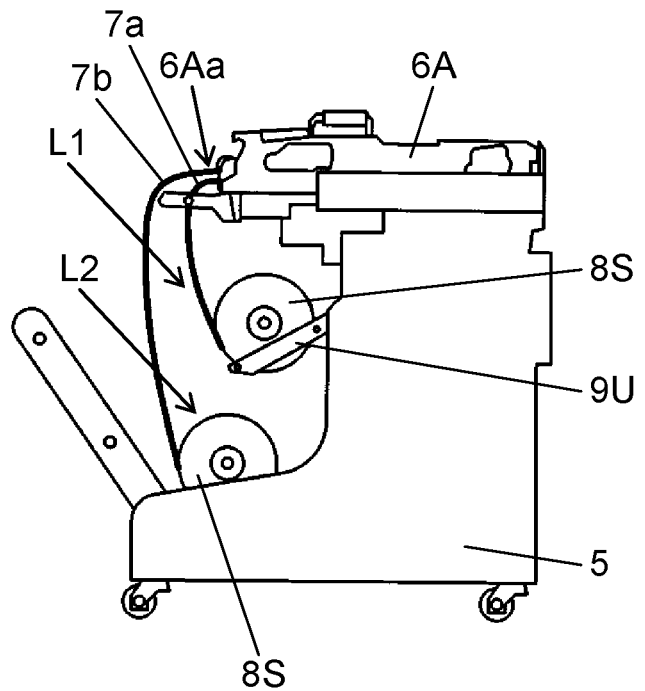
FIG. 7A is a diagram for illustrating an example where a component reel accommodating a leading tape and a following tape to be supplied to the automatic load feeder is disposed in the carriage according to the embodiment of the present disclosure.
Figure 7B:
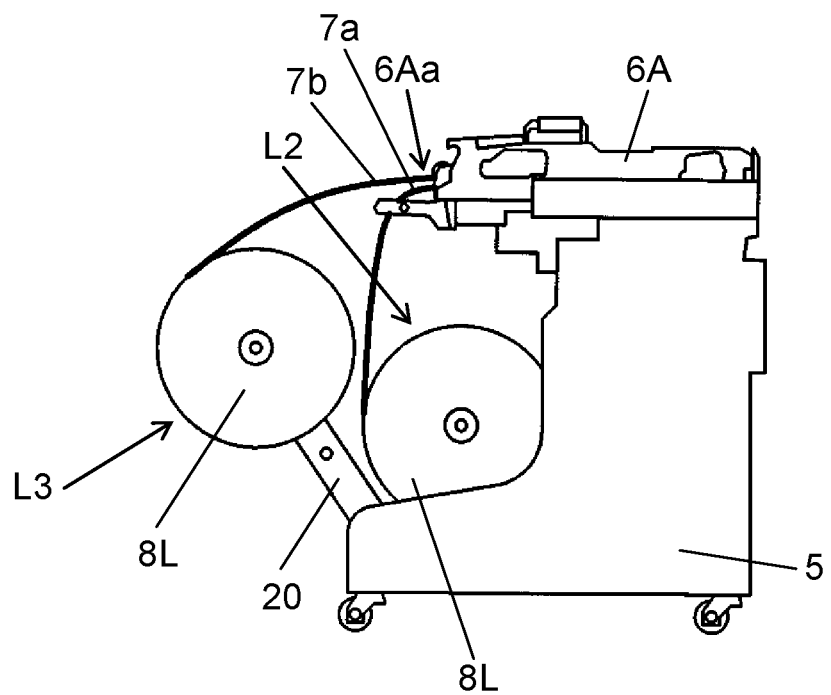
FIG. 7B is a diagram for illustrating an example where the component reel accommodating the leading tape and the following tape to be supplied to the automatic load feeder is disposed in the carriage according to the embodiment of the present disclosure.

Next, disposition of component reel 8 accommodating leading tape 7a and following tape 7b to be supplied to automatic load feeder 6A mounted on carriage 5 will be described with reference to FIGS. 7A and 7B. In FIG. 7A, small component reel 8S accommodating leading tape 7a is disposed in first holding row L1, and small component reel 8S accommodating following tape 7b is disposed in second holding row L2 farther from automatic load feeder 6A than from first holding row L1. In FIG. 7B, large component reel 8L accommodating leading tape 7a is disposed in second holding row L2, and large component reel 8L accommodating following tape 7b is disposed in third holding row L3 farther from automatic load feeder 6A than from second holding row L2.

That is, component reel 8 accommodating leading tape 7a used in the component supply device (automatic load feeder 6A) is disposed in holding row L closer to the component supply device than to component reel 8 accommodating following tape 7b to be used next in a direction perpendicular to the holding unit (carriage 5) in the horizontal plane in the direction in which the component supply devices are lined. Accordingly, it is possible to prevent leading tape 7a inserted into a lower portion of insertion port 6Aa of automatic load feeder 6A and following tape 7b inserted into an upper portion of insertion port 6Aa from interfering with each other.

Next, a configuration of a processing system of management computer 13 will be described with reference to FIG. 8. Management computer 13 includes processing unit 30, storage unit 31, input unit 32, display unit 33, and communication unit 34. Input unit 32, which is an input device such as a keyboard, a touch panel, and a mouse, is used when various commands, data, and the like, are input. Display unit 33, which is a display device such as a liquid crystal panel, displays various data and an input screen. Communication unit 34, which is a communication interface, transmits/receives, through communication network 12, data to/from a device constituting a component mounting line including component placement machine 1.

Storage unit 31, which is a storage device, stores production data 31a, line information 31b, component reel information 31c, holding unit information 31d, feeder disposition information 31e, constraint condition information 31f, component reel disposition 31g, and the like. Processing unit 30 includes, as an interval processing unit, information acquiring unit 35 and component reel disposition determining unit 36.

Production data 31a includes information necessary for mounting a component on board 3, such as the number of produced boards 3, a component name (a type) of the component mounted on board 3, and a mounting position (XY coordinates), according to each type of a mounting board to be produced. Line information 31b includes information on a device constituting the component mounting line, such as types of mounting head 4 and carriage 5 that can be mounted on component placement machine 1. Component reel information 31c includes information for identifying component reel 8 used in the component mounting line.

An example of component reel information 31c will be described with reference to FIG. 9. Component reel information 31c includes "reel number" 41, "reel diameter" 42, "accommodating tape width" 43, and "component name" 44. "Reel number" 41 is a number for identifying component reel 8. "Reel diameter" 42 is information for identifying a reel diameter of component reel 8. In this example, "S" indicates a small diameter (small component reel 8S), and "L" indicates a large diameter (large component reel 8L).

"Accommodating tape width" 43 indicates a tape width of component accommodating tape 7 wound and accommodated on component reel 8. "Component name" 44 is a component name for identifying a component accommodated in component accommodating tape 7. For example, component reel 8 having "reel number" 41 of "RS101" is small component reel 8S, which accommodates component accommodating tape 7 having a tape width of 4 mm, in which the component of which a component name is "D1234" is accommodated.

Figure 8:
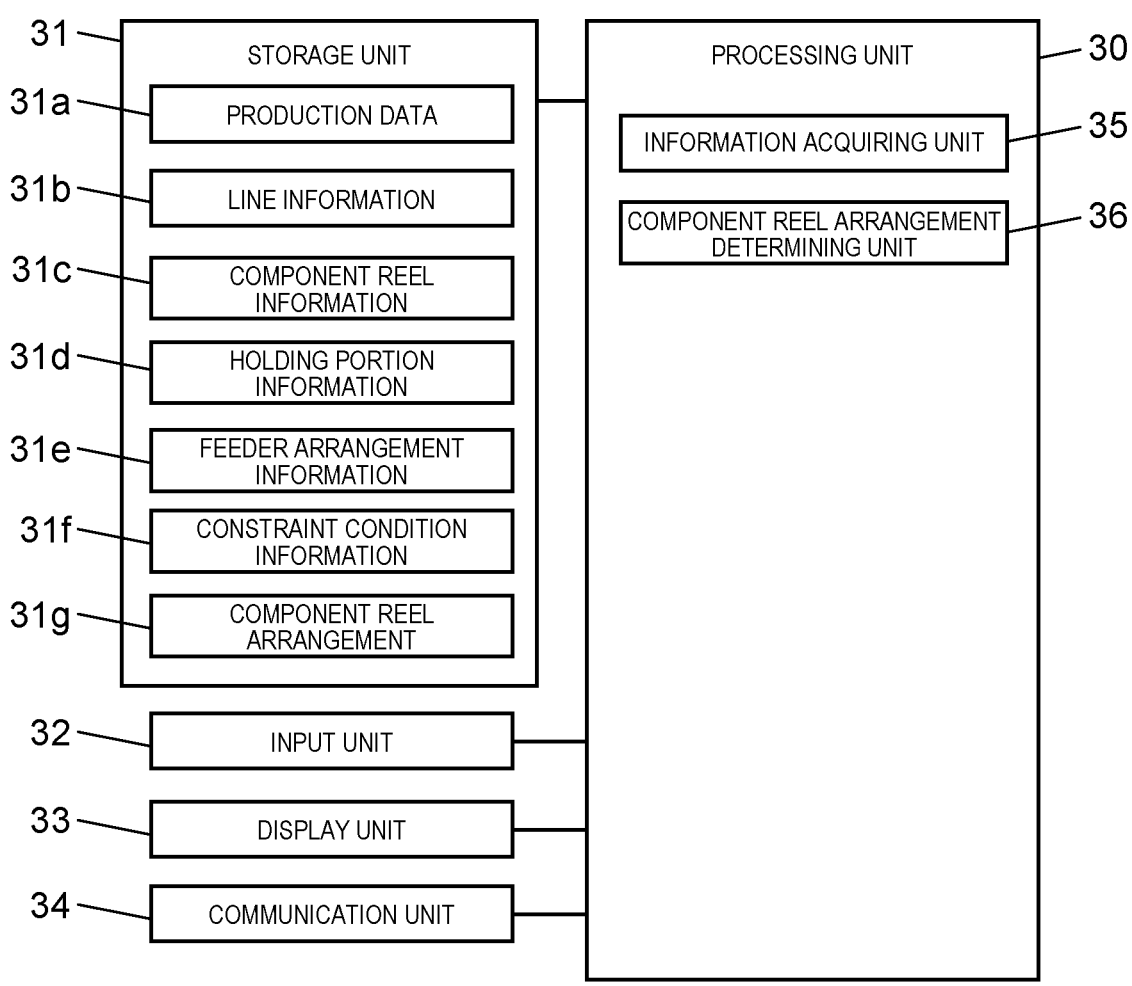
FIG. 8 is a block diagram illustrating a configuration of a management computer (an apparatus for determining disposition of the component reel) according to the embodiment of the present disclosure.

In FIG. 8, holding unit information 31d includes information on a layout that can be selected when component reel 8 is disposed in the holding unit according to each type of the holding unit (carriage 5 and reel holder 20). Here, an example of holding unit information 31d will be described with reference to FIG. 10. Holding unit information 31d illustrated in FIG. 10 indicates a combination (a layout) of component reel 8 that can be held on first holding row L1, second holding row L2, third holding row L3, and fourth holding row L4 at the positions of the holding units illustrated in FIGS. 4A 4B, 5A, and 5B in the same slot S. Holding unit information 31d includes "layout number" 51, "first holding row L1" 52, "second holding row L2" 53, "third holding row L3" 54, and "fourth holding row L4" 55.

"Layout number" 51 is a number for identifying the combination (the layout) of component reel 8. "First holding row L1" 52, "second holding row L2" 53, "third holding row L3" 54, and "fourth holding row L4" 55 indicate whether component reel 8 held in each of holding rows L1 to L4 is small component reel 8S (S) or large component reel 8L (L) or component reel 8 is not held (−). For example, a layout having "layout number" 51 of "#1" corresponds to the layout illustrated in FIG. 4A where small component reel 8S is held in all the holding rows L1 to L4. Similarly, a layout having "layout number" 51 of "#16" corresponds to the layout of FIG. 4B, a layout having "layout number" 51 of "#20" corresponds to the layout of FIG. 5A, and a layout having "layout number" 51 of "#22" corresponds to the layout of FIG. 5B.

In FIG. 8, feeder disposition information 31e includes disposition information of the component supply device (tape feeder 6) disposed in advance in carriage 5 supplying component accommodating tape 7 drawn out from component reel 8 disposed in the holding unit (carriage 5 and reel holder 20). Here, an example of feeder disposition information 31e in which automatic load feeder 6A and manual load feeder 6M are disposed in carriage 5 illustrated in FIG. 2 will be described with reference to FIG. 11. Feeder disposition information 31e is stored such that "feeder number" 62, "feeder type" 63, and "transport tape width" 64 for identifying tape feeder 6 to be mounted on slot S correspond to "slot number" 61 for identifying a position of slot S of carriage 5.

"Feeder type" 63 indicates whether tape feeder 6 is automatic load feeder 6A (automatic) or manual load feeder 6M (manual). "Transport tape width" 64 indicates a tape width of component accommodating tape 7 transported by tape feeder 6. For example, automatic load feeder 6A having "feeder number" 62 of "FA101", which transports component accommodating tape 7 having a tape width of 4 mm, is mounted on slot S1L having "slot number" 61 of "S1L". Further, manual load feeder 6M having "feeder number" 62 of "FM201", which transports component accommodating tape 7 having a tape width of 8 mm, is mounted on slot S6.

In FIG. 8, constraint condition information 31f includes information on a constraint condition related to the component supply device (tape feeder 6) and component accommodating tape 7 to be supplied to the component supply device. In more detail, constraint condition information 31f includes a relative position relationship (hereinafter, referred to as a "feeder-reel relationship") between tape feeder 6 mounted on the holding unit and component reel 8 accommodating component accommodating tape 7 to be supplied to tape feeder 6, according to the type of the holding unit (carriage 5 and reel holder 20). For example, as the feeder-reel relationship that cannot be realized, an angle at which component accommodating tape 7 drawn out from component reel 8 is inserted into insertion ports 6Aa and 6Ma of tape feeder 6 may be larger than a predetermined angle.

Further, constraint condition information 31f includes a relative position relationship (hereinafter, referred to as a "reel-reel relationship") between the plurality of component reels 8 accommodating component accommodating tape 7 to be supplied to the plurality of tape feeders 6 mounted on the holding unit. For example, as a reel-reel relationship that cannot be realized, one component accommodating tape 7 drawn out from one component reel 8 may interfere with (comes into contact with) another component accommodating tape 7 drawn out from another component reel 8.

Figure 12:
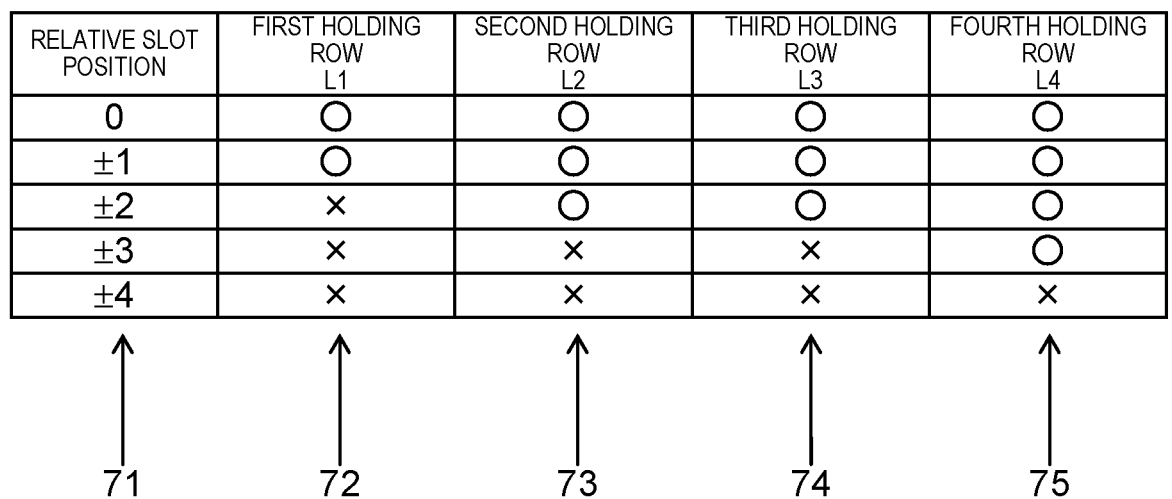
FIG. 12 is a table for illustrating an example of a constraint condition when the component reel is disposed in the holding unit according to the embodiment of the present disclosure.

Here, an example of a constraint condition related to the feeder-reel relationship when component reel 8 is disposed in the holding unit as illustrated in FIGS. 4A, 4B, 5A, and 5B will be described with reference to FIG. 12. Constraint condition information 31f related to the feeder-reel relationship is stored such that "first holding row L1" 72, "second holding row L2" 73, "third holding row L3" 74, and "fourth holding row L4" 75 as a relative position of slot S, which indicate whether or not component reel 8 can be disposed in holding rows L1 to L4 correspond to "slot relative position" 71 for identifying a relative position of slot S on which tape feeder 6 as a target is mounted with respect to component reel 8.

In "slot relative position" 71, "0" indicates a position of slot S on which tape feeder 6 is mounted, and "±1" indicates a position of slot S next to slot S, on which tape feeder 6 is mounted, by one space. "First holding row L1" 72, "second holding row L2" 73, "third holding row L3" 74, and "fourth holding row L4" 75 indicate "o" when component reel 8 can be disposed, and indicate "x" when component reel 8 cannot be disposed. For example, it is represented in first holding row L1 that although component reel 8 can be disposed at the position of slot S on which tape feeder 6 is mounted and at the position of next adjacent slot S, component reel 8 cannot be disposed at the position of slot S separated by two or more "±2" spaces.

Figure 13A:
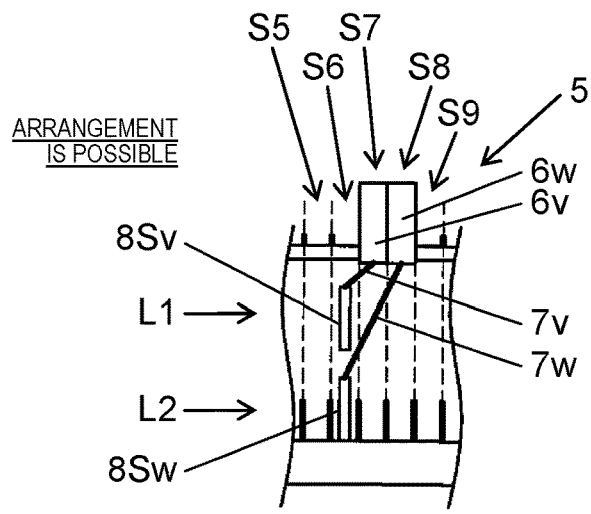
FIG. 13A is a diagram for illustrating an example where the component reel can be disposed in the holding unit according to the embodiment of the present disclosure.
Figure 13B:
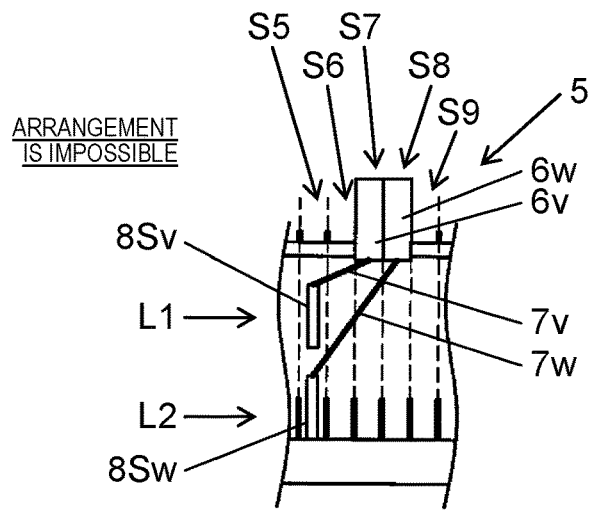
FIG. 13B is a diagram for illustrating an example where the component reel cannot be disposed in the holding unit according to the embodiment of the present disclosure.
Figure 13C:
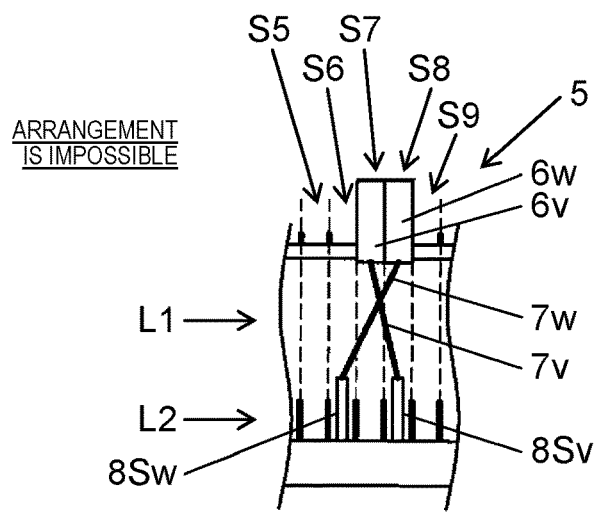
FIG. 13C is a diagram for illustrating an example where the component reel cannot be disposed in the holding unit according to the embodiment of the present disclosure.

Next, an example where component reel 8 can be disposed in carriage 5 and an example where component reel 8 cannot be disposed in carriage 5 will be described with reference to FIGS. 13A, 13B, and 13C. FIG. 13A, FIG. 13B, and FIG. 13C correspond to an example where small component reel 8Sv accommodating component accommodating tape 7v to be supplied to tape feeder 6v mounted on slot S7 of carriage 5 and small component reel 8Sw accommodating component accommodating tape 7w to be supplied to tape feeder 6w mounted on slot S8 of carriage 5 are disposed in first holding row L1 or second holding row L2.

FIG. 13A corresponds to the example where component reel 8 can be disposed in carriage 5. Small component reel 8Sv is disposed in first holding row L1 at a position of slot S6 next to slot S7 on which tape feeder 6v is mounted. Small component reel 8Sw is disposed in second holding row L2 at the position of slot S6 next to slot S8, on which tape feeder 6w is mounted, by two spaces. Both disposition positions of small component reel 8Sv and small component reel 8Sw satisfy constraint condition information 31f (the feeder-reel relationship) illustrated in FIG. 12. Further, component accommodating tape 7v and component accommodating tape 7w do not intersect each other, and satisfy constraint condition information 31f (the reel-reel relationship).

FIG. 13B corresponds to the example where component reel 8 cannot be disposed in carriage 5. Small component reel 8Sv is disposed in first holding row L1 at a position of slot S5 next to slot S7 on which tape feeder 6v is mounted, by two spaces. Small component reel 8Sw is disposed in second holding row L2 at the position of slot S5 next to slot S8 on which tape feeder 6w is mounted, by three spaces. Both disposition positions of small component reel 8Sv and small component reel 8Sw violate constraint condition information 31f (the feeder-reel relationship) illustrated in FIG. 12.

FIG. 13C corresponds to the example where component reel 8 cannot be disposed in carriage 5. Small component reel 8Sv is disposed in second holding row L2 at the position of slot S8 next to slot S7 on which tape feeder 6v is mounted. Small component reel 8Sw is disposed in second holding row L2 at the position of slot S6 next to slot S8 on which tape feeder 6w is mounted, by two spaces. Both disposition positions of small component reel 8Sv and small component reel 8Sw satisfy constraint condition information 31f (the feeder-reel relationship) illustrated in FIG. 12. However, component accommodating tape 7v and component accommodating tape 7w intersect (interfere with) each other, and violate constraint condition information 31f (the reel-reel relationship).

In this way, constraint condition information 31f includes the relative position relationship (the feeder-reel relationship) between the component supply device (tape feeder 6) and component accommodating tape 7 to be supplied to the component supply device and a relative position relationship (the reel-reel relationship) between the plurality of component accommodating tapes 7. The feeder-reel relationship included in constraint condition information 31f is respectively applied between manual load feeder 6M and component reel 8, between automatic load feeder 6A and component reel 8 accommodating leading tape 7a, and between automatic load feeder 6A and component reel 8 accommodating following tape 7b.

In FIG. 8, information acquiring unit 35 acquires various kinds of information for determining component reel disposition in which component reel 8 is disposed in the holding unit, based on production data 31a, line information 31b, component reel information 31c, holding unit information 31d, feeder disposition information 31e (disposition information of the component supply device), and constraint condition information 31f stored in storage unit 31.

Component reel disposition determining unit 36 determines the component reel disposition in which component reel 8 is disposed in carriage 5 (the holding unit) on which the component supply device (tape feeder 6) is mounted in advance, based on various kinds of the acquired information, and stores the determined component reel disposition as component reel disposition 31g in storage unit 31. In more detail, component reel disposition determining unit 36 disposes component reel 8 in the holding unit to satisfy constraint condition information 31f, based on "slot number" 61, "feeder type" 63, and "transport tape width" 64 of tape feeder 6 mounted on the holding unit (carriage 5 and reel holder 20), which are included in feeder disposition information 31e, a configuration of the holding unit, "reel diameter" 42, "accommodating tape width" 43, and "component name" 44 of component reel 8, which are included in component reel information 31c, and the selectable layout included in holding unit information 31d.

Component reel disposition determining unit 36 determines disposition of component reel 8 supplying leading tape 7a and component reel 8 supplying following tape 7b with respect to automatic load feeder 6A having "feeder type" 63 of "automatic". That is, the component reel disposition is created according to each carriage 5 (each holding unit) to be mounted on a device (component placement machine 1) constituting the component mounting line, and includes component reel 8 used in one component supply device (tape feeder 6) and component reel 8 used next. Further, component reel disposition determining unit 36 displays the determined component reel disposition on display unit 33 or the portable terminal (not illustrated) carried by the worker. Further, when there is component reel 8 which cannot be disposed, component reel disposition determining unit 36 notifies the fact to display unit 33 or the portable terminal.

Here, an example of component reel disposition 31g in which component reel 8 is allocated to the holding unit (carriage 5) illustrated in FIGS. 4A, 4B, 5A, and 5B, based on component reel information 31c illustrated in FIG. 9, feeder disposition information 31d illustrated in FIG. 10, feeder disposition information 31e illustrated in FIG. 11, and constraint condition information 31f illustrated in FIG. 12, will be described with reference to FIGS. 14 and 15. FIG. 14 illustrates a configuration of the holding unit in which component reel 8 is disposed, and illustrates whether or not component reel 8 can be disposed in holding rows L1 to L4 at a position of slot S having "slot number" 81. In "first holding row L1" 82, "second holding row L2" 83, "third holding row L3" 84, and "fourth holding row L4" 85, "o" is displayed when component reel 8 can be disposed, and "–" is displayed when component reel 8 cannot be disposed.

In FIG. 14, reel holder 20 is respectively mounted on carriage 5 between slot S1 and slot S2, between slot S4 and slot S5, between slot S7 and slot S8, between slot S10 and slot S11, and between slot S16 and slot S17. Accordingly, at positions of slot S1, S2, S4, S5, S7, S8, S10, S11, S16, and S17, component reel 8 can be disposed even in third holding row L3 and fourth holding row L4 in addition to first holding row L1 and second holding row L2.

FIG. 15 illustrates component reel disposition 31g determined by component reel disposition determining unit 36. In "first holding row L1" 91, "second holding row L2" 92, "third holding row L3" 93, and "fourth holding row L4" 94 corresponding to the position of slot S having "slot number" 81, information on component reel 8 to be disposed is illustrated and "–" is illustrated at a position where component reel 8 is not disposed. The information on component reel 8 to be disposed includes "reel number" 41 for identifying component reel 8, information (slot number) for identifying tape feeder 6 inserting component accommodating tape 7 to be accommodated, and information for identifying whether component accommodating tape 7 to be accommodated is leading tape 7a(A) or following tape 7b(B).

For example, small component reel 8S having "reel number" 41 of "RS101", which accommodates leading tape 7a to be supplied to automatic load feeder 6A mounted on slot S1L, is disposed at first holding row L1 at the position of slot S1. Further, small component reel 8S having "reel number" 41 of "RS103", which accommodates following tape 7b to be supplied to automatic load feeder 6A mounted on slot S1L is disposed in second holding row L2 at the position of slot S1.

Next, another example of component reel disposition 31g determined by component reel disposition determining unit 36 will be described with reference to FIG. 16. In this example, component reel disposition 31g is created based on a position (a folder number) where component reel 8 provided in carriage 5 (the holding unit) is disposed. In "first holding row L1" 102, "second holding row L2" 103, "third holding row L3" 104, and "fourth holding row L4" 105 corresponding to "folder number" 101, information on component reel 8 to be disposed is illustrated, and "–" is illustrated at a position where component reel 8 is not disposed.

Each holding row includes "reel number" 41, "reel diameter" 42, "tape position" information 106, and "leading/following" information 107. "Reel number" 41 is a number for identifying component reel 8. "Reel diameter" 42 includes information for identifying whether component reel 8 is small component reel 8S (S) or large component reel 8L (L). "Tape position" information 106 includes information for identifying a position (an insertion position of a tape) of tape feeder 6 mounting component accommodating tape 7 accommodated in component reel 8.

For example, "S05" indicates that component accommodating tape 7 is mounted on tape feeder 6 mounted on slot S5. Further, in the case of a double feeder that can supply two component reels 8 in parallel by one manual load feeder 6M, an insertion position of component accommodating tape 7 of tape feeder 6 is displayed as a left side (L) and a right side (R) together as indicated by "3" and "4" of "folder number" 101. Further, similarly, in the case of thin tape feeder 6S, a position of slot S mounted is displayed as a left side (L) and a right side (R) together, as indicated by "1" and "2" of "folder number" 101.

"Leading/following" information 107 includes information for identifying whether component accommodating tape 7 accommodated in component reel 8 is leading tape 7a (A) or following tape 7b (B). As in component reel disposition 31g illustrated in FIG. 16, when the number of slots S in which tape feeder 6 is disposed is different from the number of positions where component reels 8 are disposed using the folder number as a reference, visibility when the worker disposes component reel 8 increases.

Component reel disposition 31g determined in this manner is displayed on display unit 33, the portable terminal possessed by the worker, or a display unit (not illustrated) of component placement machine 1 as a serving list. Component reel disposition 31g illustrated in FIGS. 15 and 16 corresponds to an example when reel holder 20 is used, and both first holding row L1 and second holding row L2 are displayed when reel holder 20 is not used.

Figure 17:
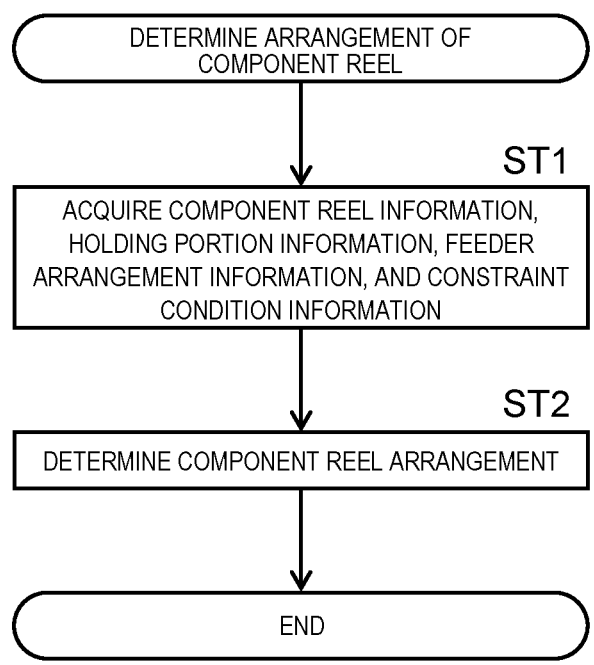
FIG. 17 is a flowchart illustrating a method of determining disposition of the component reel according to the embodiment of the present disclosure.

Next, a method of determining disposition of a component reel, which determines component reel disposition in which component reel 8 is disposed in the holding unit will be described along flow of FIG. 17. First, information acquiring unit 35 acquires component reel information 31c, holding unit information 31d, feeder disposition information 31e (disposition information of the component supply device), and constraint condition information 31f (ST1). Next, component reel disposition determining unit 36 determines component reel disposition in which component reel 8 is disposed in the holding unit, based on the acquired information (ST2). Component reel disposition determining unit 36 stores the determined component reel disposition as component reel disposition 31g and displays the determined component reel disposition on display unit 33 or the portable terminal. Further, when there is component reel 8 that cannot be disposed, component reel disposition determining unit 36 notifies the fact to display unit 33 or the portable terminal.

As described above, management computer 13 according to the present embodiment is an apparatus for determining disposition of a component reel, which determines component reel disposition, the apparatus including information acquiring unit 35 that acquires component reel information 31c including information for identifying component reel 8 used, holding unit information 31d including information on the layout that can be selected when component reel 8 is disposed in the holding unit, disposition information (feeder disposition information 31e) of the component supply device (tape feeder 6) disposed in the holding unit, and constraint condition information 31f on the component supply device and component accommodating tape 7 to be supplied to the component supply device, and component reel disposition determining unit 36 that determines component reel disposition including component reel 8 used in one component supply device and component reel 8 to be used next. Accordingly, optimum component reel disposition can be determined.

In the above description, it is understood by those skilled in the art that although there are two kinds of the reel diameter of component reel 8, such as small component reel 8S and large component reel 8L, the reel diameter of component reel 8 is not limited to the two kinds. Even when there are three kinds or more of component reels 8, optimum disposition of component reel 8 can be determined. Further, it is understood by those skilled in the art that a modification example of carriage 5 and reel holder 20 constituting the holding unit is also within the scope of the present disclosure.

Further, a combination of component reel 8 and tape feeder 6 constituting component supply unit U may be set in advance or an appropriate combination may be determined based on production data 31a. When the combination may be set in advance, combined tape feeder 6 is determined based on component reel information 31c on component reel 8 in addition to feeder type information used for component reel information 31c on component reel 8. Further, when the combination is determined based on production data 31a, the number of components used is predicted based on the number of produced boards 3 and a component name (a type) of a component mounted on board 3. When it is determined based on component reel information 31c that additional supply to component reel 8 is required, automatic load feeder 6A is combined, and when it is determined that the additional supply to component reel 8 is not required, manual load feeder 6M is combined, and tape feeder 6 to be combined is determined.

Further, in the above description, detachable reel holder 20 is mounted on carriage 5 to hold large component reel 8L having a large reel diameter in a plurality of holding rows at the same position of slot S. However, when using carriage 5 for holding large component reel 8L having a large reel diameter in a plurality of holding rows at the same position of slot S, it is not necessary to mount reel holder 20.

A method of determining disposition of a component reel and an apparatus for determining disposition of a component reel according to the present disclosure have an effect that it is possible to determine optimum component reel disposition and are useful in the field of mounting components on a board.

What is claimed is:

1. A method of disposing a plurality of component reels in a component reel disposition on a holding unit of a component placement machine, the component reel disposition including selected layouts of the plurality of component reels in a plurality of layout positions of the holding unit, each of the layout positions including a plurality of reel holders that hold the plurality of component reels, wherein the component placement machine includes a management computer and a plurality of component supply devices in a plurality of slots in which the plurality of layout positions of the holding unit correspond to the slots of the component supply devices obtained by winding a plurality of component accommodating tapes accommodating components to be supplied to the component supply devices from the holding unit, the method comprising:

acquiring component reel information via an information acquiring unit of the management computer including information for identifying the plurality of component reels, holding unit information including information related to layouts of the component reels disposed on the reel holders in a particular layout position of the holding unit that are capable of being selected without interference, disposition information of the component supply devices supplying the plurality of component accommodating tapes drawn out from the plurality of component reels including the slots that each of the component supply devices are disposed in, and constraint condition information related to the component supply devices and the plurality of component accommodating tapes to be supplied to the component supply devices including the component supply devices that can draw out the component accommodating tapes from each of the reel holders of each of the layout positions of the holding unit;

determining the component reel disposition of all of the component reels to be disposed on the reel holders of the holding unit including selected layouts of the component reels for each layout position of the holding unit via a component reel disposition determining unit of the management computer based on the acquired component reel information, the acquired holding unit information, the acquired disposition information, the acquired constraint condition information and wherein one component reel firstly used by the component supply device of a particular slot among the plurality of component reels of a particular layout position and a next component reel used next by the component supply device of the particular slot among the plurality of component reels of the particular layout position; and disposing the component reels on the holding unit according to the determined component reel disposition.

2. The method of disposing the plurality of component reels in the component reel disposition of claim 1, wherein the constraint condition information includes a relative position relationship between the component supply devices and the plurality of component accommodating tapes to be supplied to the component supply devices.

3. The method of disposing the plurality of component reels in the component reel disposition of claim 1, further comprising:

disposing the one component reel of the particular layout position at a position that is closer to the component supply device than the next component reel of the particular layout position to the component supply device in a direction perpendicular in a horizontal plane to a direction in which the plurality of the component supply devices are arranged side by side.

4. The method of disposing the plurality of component reels in the component reel disposition of claim 3, wherein the holding unit has a plurality of holding rows at each layout position that hold the plurality of component reels, and wherein the position that is closer to the component supply device of the one component reel of the particular layout position is a position of any one of the plurality of holding rows.

5. The method of disposing the plurality of component reels in the component reel disposition of claim 1, wherein the component reel information includes information on reel diameters of the plurality of component reels, and wherein the selectable layout changes depending on the reel diameters of the plurality of component reels.

6. The method of disposing the plurality of component reels in the component reel disposition of claim 1, further comprising: displaying the determined component reel disposition.

7. An apparatus for placing components configured to determine a component reel disposition of a plurality of component reels, the apparatus comprising:

a plurality of component supply devices in a plurality of slots of the apparatus;

a holding unit including a plurality of layout positions corresponding to the slots and each layout position includes a plurality of reel holders that hold the plurality of component reels obtained by winding a plurality of component accommodating tapes accommodating components to be supplied to the component supply devices from the holding unit, the component reel disposition including selected layouts of the plurality of component reels in the plurality of layout positions of the holding unit;

an information acquiring unit that acquires component reel information including information for identifying the plurality of component reels, holding unit information including information related to layouts of the component reels disposed on the reel holders in a particular layout position of the holding unit that are capable of being selected without interference, disposition information of the component supply devices supplying the plurality of component accommodating tapes drawn out from the plurality of component reels including the slots that each of the component supply devices are disposed in, and constraint condition information related to the component supply devices and the plurality of component accommodating tapes to be supplied to the component supply devices including the component supply devices that can draw out the component accommodating tapes from each of the reel holders of each of the layout positions of the holding unit; and a component reel disposition determining unit that determines the component reel disposition of all of the component reels to be disposed on the reel holders of the holding unit including selected layouts of the component reels for each layout position of the holding unit based on the acquired component reel information, the acquired holding unit information, the acquired disposition information, the acquired constraint condition information and wherein one component reel firstly used by the component supply device of a particular slot among the plurality of component reels of a particular layout position and a next component reel used next by the component supply device of the particular slot among the plurality of component reels of the particular layout position.

8. The apparatus for placing components configured to determine a component reel disposition of claim 7, wherein the constraint condition information includes a relative position relationship between the component supply devices and the plurality of component accommodating tapes to be supplied to the component supply devices.

9. The apparatus for placing components configured to determine a component reel disposition of claim 7, wherein the component reel disposition determining unit disposes the one component reel of the particular layout position at a position that is closer to the component supply device than the next component reel of the particular layout position to the component supply device in a direction perpendicular in a horizontal plane to a direction in which the plurality of the component supply devices are arranged side by side.

10. The apparatus for placing components configured to determine a component reel disposition of claim 9, wherein the holding unit has a plurality of holding rows that hold the plurality of component reels, and wherein the position that is closer to the component supply device of the one component reel of the particular layout position is a position of any one of the plurality of holding rows.

11. The apparatus for placing components configured to determine a component reel disposition of claim 7, wherein the component reel information includes information on reel diameters of the plurality of component reels, and wherein the selectable layout changes depending on the reel diameters of the plurality of component reels.

12. The apparatus for placing components configured to determine a component reel disposition of claim 7, further comprising:
a display unit that displays the determined component reel disposition.

* * * * *